(12) United States Patent
Kita

(10) Patent No.: US 10,432,171 B2
(45) Date of Patent: Oct. 1, 2019

(54) RADIO-FREQUENCY MODULE

(71) Applicant: Murata Manufacturing Co., Ltd., Nagaokakyo-shi, Kyoto-fu (JP)

(72) Inventor: Terumichi Kita, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 116 days.

(21) Appl. No.: 15/857,710

(22) Filed: Dec. 29, 2017

(65) Prior Publication Data
US 2018/0145642 A1    May 24, 2018

Related U.S. Application Data

(63) Continuation of application No. PCT/JP2016/066362, filed on Jun. 2, 2016.

(30) Foreign Application Priority Data

Jul. 3, 2015  (JP) .................................. 2015-134553

(51) Int. Cl.
*H03F 1/32* (2006.01)
*H03H 9/145* (2006.01)
(Continued)

(52) U.S. Cl.
CPC ............... *H03H 9/145* (2013.01); *H03F 1/32* (2013.01); *H03F 1/3205* (2013.01); *H03F 1/56* (2013.01);
(Continued)

(58) Field of Classification Search
CPC .............. H03H 1/0007; H03H 9/02574; H03H 9/1092; H03H 9/125; H03H 9/132;
(Continued)

(56) References Cited

U.S. PATENT DOCUMENTS

| 4,160,963 A | * | 7/1979 | Hays, Jr. ............. H03H 9/14544 310/313 C |
| 6,072,377 A | * | 6/2000 | Tajima ............... H03H 9/02992 310/313 B |

(Continued)

FOREIGN PATENT DOCUMENTS

| CN | 104467733 A | 3/2015 |
| JP | 52-141194 A | 11/1977 |

(Continued)

OTHER PUBLICATIONS

Official Communication issued in International Patent Application No. PCT/JP2016/066362, dated Aug. 16, 2016.

*Primary Examiner* — Barbara Summons
(74) *Attorney, Agent, or Firm* — Keating & Bennett, LLP

(57) ABSTRACT

A radio-frequency module includes a filter connected at one end to an input terminal and at the other end to an output terminal, and an amplifier connected at one end to the output terminal and at the other end to the other end of the filter. The filter includes first and second filter portions. The first filter portion is disposed on a signal line electrically connecting the input terminal and the output terminal. The second filter portion is connected between the signal line and a ground. Each of the first and second filter portions includes a surface acoustic wave resonator including an IDT electrode on a piezoelectric substrate. The IDT electrode includes first and second electrode fingers. In the surface acoustic wave resonator of the second filter portion, at least some of the first and second electrode fingers are electrically connected to each other.

4 Claims, 3 Drawing Sheets

(51) Int. Cl.
*H03F 3/19* (2006.01)
*H03H 1/00* (2006.01)
*H03H 9/64* (2006.01)
*H03F 1/56* (2006.01)
*H03H 9/02* (2006.01)
*H03H 9/10* (2006.01)

(52) U.S. Cl.
CPC ............. *H03F 3/19* (2013.01); *H03H 1/0007* (2013.01); *H03H 9/6436* (2013.01); *H03H 9/6483* (2013.01); *H03F 2200/165* (2013.01); *H03F 2200/294* (2013.01); *H03H 9/02574* (2013.01); *H03H 9/1092* (2013.01)

(58) Field of Classification Search
CPC .. H03H 9/145; H03H 9/14502; H03H 9/6436; H03H 9/6483; H03F 1/32; H03F 1/3205; H03F 1/56; H03F 3/19; H03F 2200/165; H03F 2200/294
USPC .......................................... 333/133, 193–196
See application file for complete search history.

(56) References Cited

U.S. PATENT DOCUMENTS

| | | | | |
|---|---|---|---|---|
| 6,714,099 | B2* | 3/2004 | Hikita | .................. H03H 9/0028 333/133 |
| 7,671,705 | B2* | 3/2010 | Nakazawa | ........... H03H 9/0057 310/313 B |
| 2010/0259342 | A1 | 10/2010 | Yamane | |
| 2015/0070108 | A1 | 3/2015 | Kajihara | |
| 2016/0164491 | A1 | 6/2016 | Muto | |

FOREIGN PATENT DOCUMENTS

| | | | |
|---|---|---|---|
| JP | 4 05-299967 A | * | 11/1993 |
| JP | 4 06-350383 A | * | 12/1994 |
| JP | 2006-345118 A | | 12/2006 |
| JP | 2007-142712 A | | 6/2007 |
| JP | 2010-268429 A | | 11/2010 |
| JP | 2015-023474 A | | 2/2015 |
| WO | 2015/025603 A1 | | 2/2015 |

* cited by examiner

RADIO-FREQUENCY MODULE

CROSS REFERENCE TO RELATED APPLICATIONS

This application claims the benefit of priority to Japanese Patent Application No. 2015-134553 filed on Jul. 3, 2015 and is a Continuation Application of PCT Application No. PCT/JP2016/066362 filed on Jun. 2, 2016. The entire contents of each application are hereby incorporated herein by reference.

BACKGROUND OF THE INVENTION

1. Field of the Invention

The present invention relates to a radio-frequency module.

2. Description of the Related Art

As a circuit included in a radio-frequency module of the related art, a receive circuit disclosed in Japanese Unexamined Patent Application Publication No. 2007-142712, for example, is known. FIG. 6 is a circuit diagram of a receive circuit 1 included in a radio-frequency module of the related art. As shown in FIG. 6, the receive circuit 1 includes a SAW filter 2, a low-noise amplifier 3, an inductor 9, an input terminal 6, and an output terminal 5. One end of the SAW filter 2 is connected to the input terminal 6, while the other end thereof is connected to one end of the low-noise amplifier 3. The other end of the low-noise amplifier 3 is connected to the output terminal 5. The inductor 9, which is grounded, is disposed between the SAW filter 2 and the low-noise amplifier 3.

The SAW filter 2 is defined by surface acoustic wave resonators 2a, 2b, 2c, and 2d. The surface acoustic wave resonators 2a and 2b are connected in series between the input terminal 6 and the low-noise amplifier 3. The surface acoustic wave resonator 2c is connected between a ground and a signal line connecting the surface acoustic wave resonator 2a and one end of the low-noise amplifier 3. The surface acoustic wave resonator 2d is connected between a ground and a signal line connecting the surface acoustic wave resonator 2b and the input terminal 6.

A low-noise amplifier exhibits nonlinear characteristics when power at a certain level or higher is input. A signal having power at a certain level or higher input into a receive circuit including the low-noise amplifier 3 thus causes noise in the low-noise amplifier 3. For example, in the receive circuit 1 of the radio-frequency module in which the SAW filter 2 and the low-noise amplifier 3 are directly connected to each other without the inductor 9 interposed therebetween in FIG. 6, noise in the low-noise amplifier 3 propagates to the SAW filter 2. Noise is then reflected by the surface acoustic wave resonator 2a of the SAW filter 2 and is input into the low-noise amplifier 3. As a result, distortion characteristics of the receive circuit 1 of the radio-frequency module deteriorate. To address this issue, in the receive circuit 1 of the radio-frequency module disclosed in Japanese Unexamined Patent Application Publication No. 2007-142712, the grounded inductor 9 is provided between the surface acoustic wave resonator 2a forming the SAW filter 2 and the low-noise amplifier 3 so that noise is able to be transmitted to a ground. This structure is able to improve distortion characteristics of the receive circuit 1 of the radio-frequency module.

The provision of the grounded chip inductor 9 between the SAW filter 2 and the low-noise amplifier 3 to improve distortion characteristics of the receive circuit 1 of the radio-frequency module increases the size of the radio-frequency module.

SUMMARY OF THE INVENTION

Preferred embodiments of the present invention provide radio-frequency modules that each include a filter and an amplifier. The filter is connected at one end to an input terminal and at the other end to an output terminal. The amplifier is connected at one end to the output terminal and at the other end to the other end of the filter. The filter includes first and second filter portions. The first filter portion is disposed on a signal line electrically connecting the input terminal and the output terminal. The second filter portion is connected between the signal line and a ground. Each of the first and second filter portions includes a surface acoustic wave resonator including an IDT electrode provided on a piezoelectric substrate. The IDT electrode includes a first busbar, a second busbar, a plurality of first electrode fingers, and a plurality of second electrode fingers. The second busbar is disposed to oppose the first busbar. The plurality of first electrode fingers extend from the first busbar toward the second busbar so as not to reach the second busbar. The plurality of second electrode fingers extend from the second busbar toward the first busbar so as not to reach the first busbar, and are disposed between the plurality of first electrode fingers in an interdigitated manner. In the surface acoustic wave resonator defining the second filter portion, at least some of the first and second electrode fingers are electrically connected to each other.

With this configuration, low-frequency noise is able to be transmitted to a ground by using a surface acoustic wave resonator, instead of a grounded inductor. Surface acoustic wave resonators are able to be provided in the first and second filter portions by using the same piezoelectric substrate, thus making it possible to reduce the size of a radio-frequency module to be smaller than when a grounded inductor is provided.

A filter of the radio-frequency module according to a preferred embodiment of the present invention may be a ladder filter including a series arm and a parallel arm. The first filter portion may define the series arm of the ladder filter. The second filter portion may define the parallel arm of the ladder filter.

With this configuration, an electrically connecting portion is provided in a surface acoustic wave resonator disposed on the parallel arm of the ladder filter defined by the second filter portion. The manufacturing of the radio-frequency module is thus facilitated, and also, the size of the radio-frequency module is able to be reduced.

A surface acoustic wave resonator defining the second filter portion in which at least some of the first and second electrode fingers are electrically connected to each other according to a preferred embodiment of the present invention may be connected between the amplifier and the surface acoustic wave resonator defining the first filter portion positioned closest to the amplifier.

With this configuration, the surface acoustic wave resonator defining the second filter portion in which an electrically connecting portion is provided is located closest to the low-noise amplifier, thus making it possible to more efficiently transmit low-frequency noise to a ground.

A first filter portion of a filter of a radio-frequency module according to a preferred embodiment of the present invention may include a longitudinally coupled resonator filter.

With this configuration, the first and second filter portions are able to be provided on the same piezoelectric substrate, thus making it possible to reduce the size of the radio-frequency module.

According to preferred embodiments of the present invention, it is possible to provide small radio-frequency modules in which an influence of noise caused by the nonlinear characteristics of an amplifier is reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Radio-frequency modules according to preferred embodiments of the present invention will be described below with reference to the drawings.

First Preferred Embodiment

Figure 1:
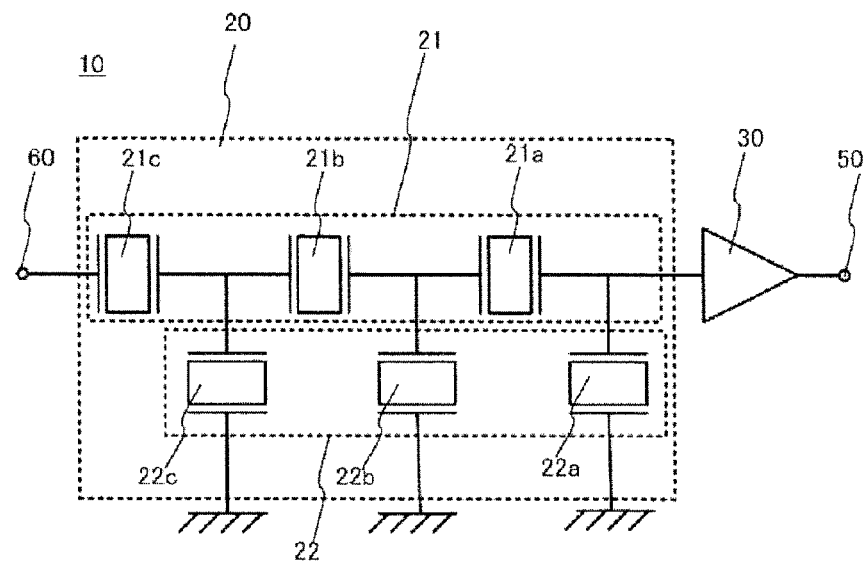
FIG. 1 is a circuit diagram of a radio-frequency module according to a first preferred embodiment of the present invention.

FIG. 1 is a circuit diagram of a radio-frequency module according to a first preferred embodiment of the present invention. The radio-frequency module 10 is defined by a receive circuit. As shown in FIG. 1, the radio-frequency module 10 includes a filter 20 and a low-noise amplifier 30. One end of the filter 20 is connected to an input terminal 60, and the other end thereof is connected to an output terminal 50. One end of the low-noise amplifier 30 is connected to the output terminal 50, and the other end thereof is connected to the other end of the filter 20.

The filter 20 includes first and second filter portions 21 and 22. The first filter portion 21 is disposed on a signal line connecting the input terminal 60 and the output terminal 50. The second filter portion 22 is connected between this signal line and a ground. That is, the filter 20 is preferably a ladder filter including a series arm defined by the first filter portion 21 and a parallel arm defined by the second filter portion 22. The first filter portion 21 is defined by surface acoustic wave resonators 21a, 21b, and 21c which are connected in a direction from the output terminal 50 to the input terminal 60 in this order. The second filter portion 22 is defined by surface acoustic wave resonators 22a, 22b, and 22c. The surface acoustic wave resonator 22a is connected between a ground and a signal line connecting the surface acoustic wave resonator 21a and the low-noise amplifier 30. The surface acoustic wave resonator 22b is connected between a ground and a signal line connecting the surface acoustic wave resonators 21a and 21b. The surface acoustic wave resonator 22c is connected between a ground and a signal line connecting the surface acoustic wave resonators 21b and 21c.

Preferably, the filter 20 has a chip shape and includes a piezoelectric substrate, while the low-noise amplifier 30 is has a chip shape and includes a semiconductor substrate, for example. The filter 20 and the low-noise amplifier 30 are mounted on one main surface of the same multilayer substrate such that they are connected in series with each other. As a material used for the multilayer substrate, a thermoplastic resin, such as polyimide and a liquid crystal polymer, a thermosetting resin, such as an epoxy resin, or ceramic, for example, may preferably be used. In this manner, the filter 20 and the low-noise amplifier 30 are structured as a single radio-frequency module.

Figure 2:
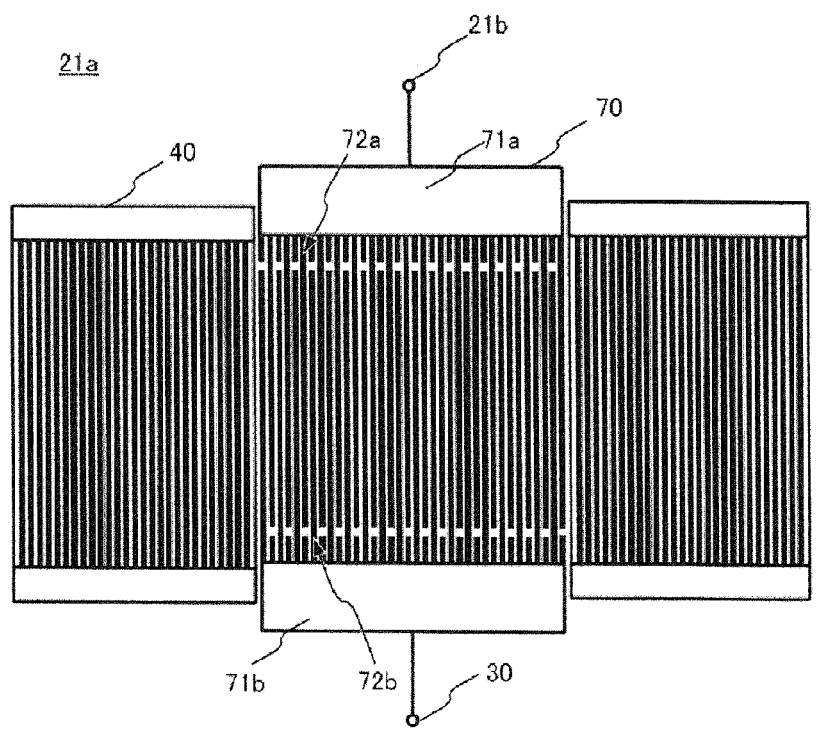
FIG. 2 is a schematic view of a surface acoustic wave resonator 21a included in the radio-frequency module 10 shown in FIG. 1.

FIG. 2 is a schematic view of the surface acoustic wave resonator 21a according to the first preferred embodiment of the present invention. The surface acoustic wave resonator 21a includes an IDT electrode 70 provided on a piezoelectric substrate and a pair of reflectors 40 located to sandwich the IDT electrode 70 therebetween. The IDT electrode 70 includes a first busbar 71a, a second busbar 71b, a plurality of first electrode fingers 72a, and a plurality of second electrode fingers 72b. The second busbar 71b opposes the first busbar 71a. The plurality of first electrode fingers 72a extend from the first busbar 71a toward the second busbar 71b such that they do not reach the second busbar. The plurality of second electrode fingers 72b extend from the second busbar 71b toward the first busbar 71a such that they do not reach the first busbar 71a. The second electrode fingers 72b are disposed between the first electrode fingers 72a in an interdigital manner. The first busbar 71a of the surface acoustic wave resonator 21a is connected to the surface acoustic wave resonator 21b, while the second busbar 71b thereof is connected to the low-noise amplifier 30. The structures of the surface acoustic wave resonators 21b and 21c are preferably the same or substantially the same as the structure of the surface acoustic wave resonator 21a, and a detailed explanation thereof will be omitted. The structures of the surface acoustic wave resonators 22b and 22c are preferably the same or substantially the same as the structure of the surface acoustic wave resonator 21a, except that the first busbar 71a is connected to the first filter portion 21 and the second busbar 71b is connected to a ground.

Figure 3A:
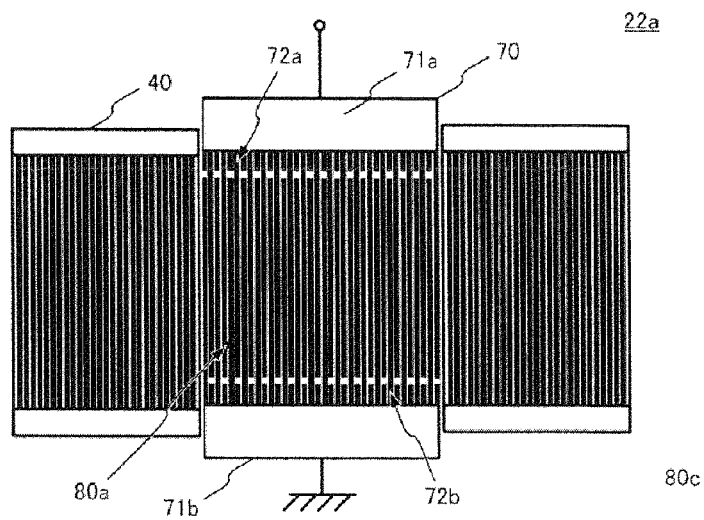
FIG. 3A is a schematic view of a surface acoustic wave resonator 22a included in the radio-frequency module 10 shown in FIG. 1.
Figure 3B:
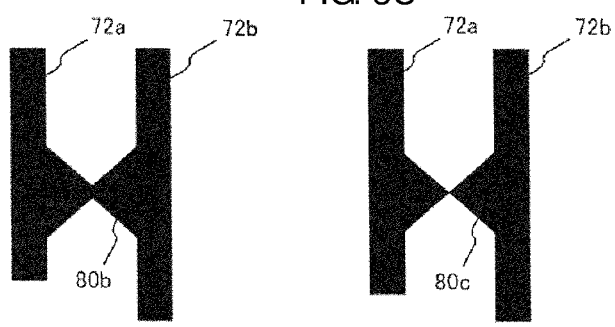
FIG. 3B is an enlarged view of an electrically connected portion 80b with a shape that is different from an electrically connecting portion 80a of the surface acoustic wave resonator 22a shown in FIG. 3A.
Figure 3C:
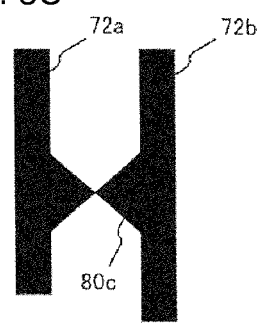
FIG. 3C is an enlarged view of an electrically connected portion 80c with a shape different from the electrically connected portion 80a of the surface acoustic wave resonator 22a shown in FIG. 3A.

FIG. 3A is a schematic view of the surface acoustic wave resonator 22a according to the first preferred embodiment of the present invention. The surface acoustic wave resonator 22a, as well as the surface acoustic wave resonator 21a, includes an IDT electrode 70 provided on a piezoelectric substrate and a pair of reflectors 40 located to sandwich the IDT electrode 70 therebetween. The IDT electrode 70 includes a first busbar 71a, a second busbar 71b, a plurality of first electrode fingers 72a, and a plurality of second electrode fingers 72b. The second busbar 71b opposes the first busbar 71a. The plurality of first electrode fingers 72a extend from the first busbar 71a toward the second busbar 71b such that they do not reach the second busbar. The plurality of second electrode fingers 72b extend from the second busbar 71b toward the first busbar 71a such that they do not reach the first busbar 71a. The second electrode fingers 72b are disposed between the first electrode fingers 72a in an interdigitated manner. The first busbar 71a of the surface acoustic wave resonator 22a is connected to the first filter portion 21, while the second busbar 71b thereof is connected to a ground. An electrically connected portion 80a is provided between at least one pair of a first electrode finger 72a and a second electrode finger 72b adjacent to each other, among the plurality of first and second electrode fingers 72a and 72b. The size and the shape of the electrically connected portion 80a are not restricted to a particular size and a particular shape, and an electrically connected portion 80a of any suitable size and shape that is able to transmit noise to a ground may be used. The electrically connected portion 80a may be very small to such a degree as to electrically connect the first and second electrode fingers 72a and 72b. If necessary, a plurality of electrically connected portions 80a may be provided. The shape of the electrically connected portion 80a is not restricted to a rectangle or a substantial rectangle. For example, an electrically connected portion 80b in the shape of a drum with a thinner center portion may be used, as shown in FIG. 3B. Alternatively, an electrically connected portion 80c defined by two triangles with their apexes contacting each other may be used, as shown in FIG. 3C.

The electrically connected portion 80a, 80b, or 80c is preferably provided in a surface acoustic wave resonator, such as in the surface acoustic wave resonator 22a shown in FIGS. 1 and 3A, which is located closest to the low-noise amplifier 30 and is grounded in parallel with the low-noise amplifier 30. This configuration enables more efficient transmission of low-frequency noise to a ground, thus making it possible to improve distortion characteristics of the radio-frequency module 10. The mere provision of the electrically connected portion 80a, 80b, or 80c in a portion of the filter 20 defining the ladder filter in order to transmit low-frequency noise to a ground is sufficient. The manufacturing of the radio-frequency module is thus facilitated, the size of the radio-frequency module is able to be reduced.

The surface acoustic wave resonator 22a of the radio-frequency module 10 in the present preferred embodiment was produced as follows, and IIP3 characteristics were measured.

As the IDT electrode 70 of the surface acoustic wave resonator 22a, the following IDT electrode was provided: thirty pairs of electrode fingers were provided; the width of an electrode finger was about 0.464 μm; the gap between electrode fingers was about 0.464 μm; and an electrically connected portion 80a of about 0.464 μm×about 0.04 μm was provided between the electrode fingers of the first pair from the left.

IIP3 characteristics in Band7 of the radio-frequency module including the surface acoustic wave resonator 22a with the IDT electrode 70 and the electrically connected portion 80a according to the present preferred embodiment were measured. IIP3 characteristics in Band7 of a known radio-frequency module including a surface acoustic wave resonator with an IDT electrode that does not include an electrically connected portion were also measured. As a result, IIP3 characteristics of the radio-frequency module of the present preferred embodiment measured about −2 dBm, while IIP3 characteristics of the known radio-frequency module measured about −6 dBm. It has thus been confirmed that IIP3 characteristics of the radio-frequency module of the present preferred embodiment were improved.

Second Preferred Embodiment

Figure 4:
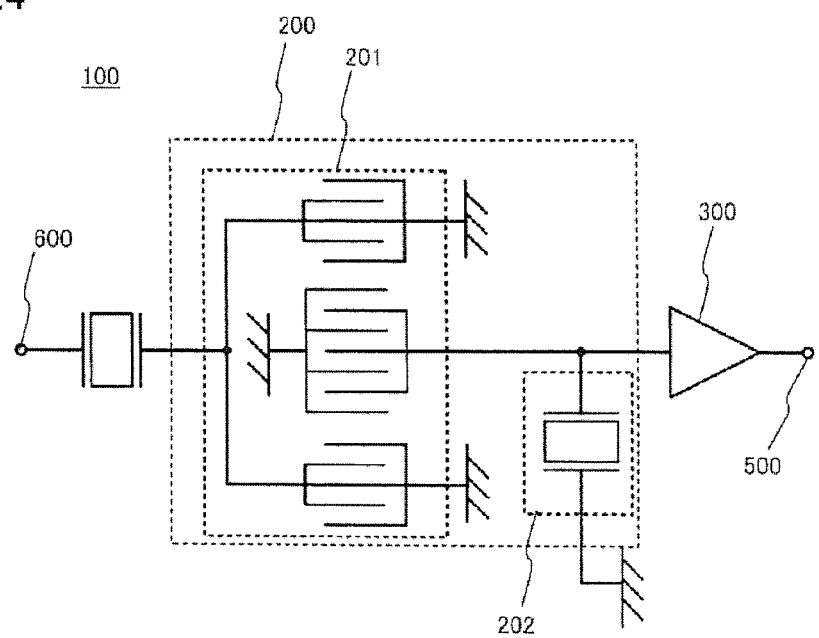
FIG. 4 is a circuit diagram of a radio-frequency module 100 according to a second preferred embodiment of the present invention.

FIG. 4 is a circuit diagram of a radio-frequency module 100 according to a second preferred embodiment of the present invention.

As shown in FIG. 4, the radio-frequency module 100 includes a filter 200 and a low-noise amplifier 300. One end of the filter 200 is connected to an input terminal 600, and the other end thereof is connected to an output terminal 500. One end of the low-noise amplifier 300 is connected to the output terminal 500, and the other end thereof is connected to the other end of the filter 200.

The filter 200 includes first and second filter portions 201 and 202. The first filter portion 201 is disposed on a signal line connecting the input terminal 600 and the output terminal 500. The second filter portion 202 is connected between the signal line and a ground. Each of the first and second filter portions 201 and 202 is defined by a surface acoustic wave resonator. The first filter portion 201 is preferably a longitudinally coupled resonator filter, for example. The configuration of the surface acoustic wave resonator defining the second filter portion 202 is similar to that of the surface acoustic wave resonator 22a shown in FIG. 3A, and an electrically connected portion is provided in at least some of the electrode fingers. The first and second filter portions 201 and 202 are able to be provided on the same piezoelectric substrate, thus making it possible to reduce the size of the radio-frequency module.

The present invention is not restricted to the first and second preferred embodiments. For example, by changing the amplifier from a low-noise amplifier to a power amplifier, the present invention may be applied, not only to a receive circuit, but also to a transmit circuit. The radio-frequency module may include an element other than elements of a receive circuit and a transmit circuit.

Figure 5:
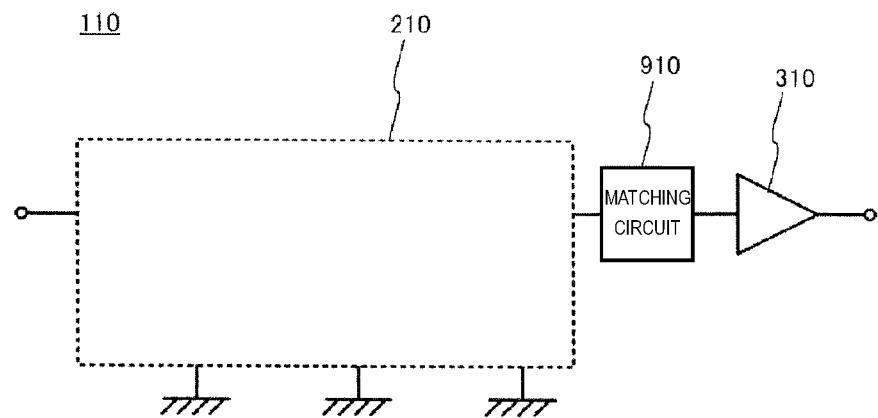
FIG. 5 is a schematic diagram of a radio-frequency module 110 according to another preferred embodiment of the present invention.
Figure 6:
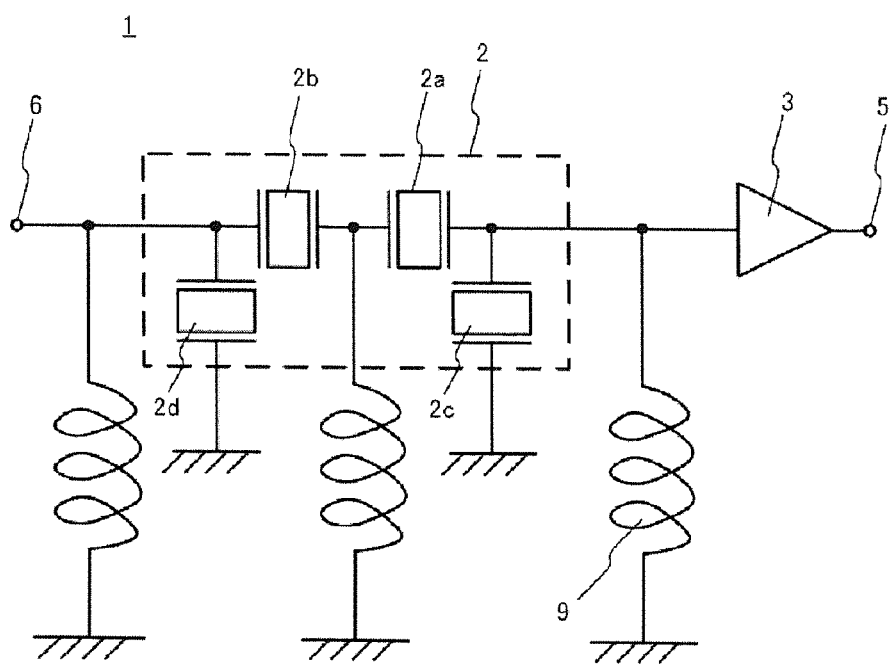
FIG. 6 is a circuit diagram of a receive circuit 1 included in a radio-frequency module of the related art.

As shown in FIG. 5, a matching circuit 910 may preferably be disposed between a filter 210 and an amplifier 310 so as to perform impedance matching therebetween. The filter may preferably be a CSP (chip size package) or a WLP (wafer level package), for example. The filter and chip components such as an amplifier mounted on a multilayer substrate may preferably be coated with an epoxy resin, for example. This protects chip components, which improves the reliability. A shield electrode may preferably be provided on a coating, such as an epoxy resin, for example. This prevents the entry of external noise into the radio-frequency module and also prevents the spreading of noise radiated from the inside of the radio-frequency module.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A radio-frequency module comprising:
   a filter that is connected at one end to an input terminal and at another end to an output terminal; and
   an amplifier that is connected at one end to the output terminal and at another end to the another end of the filter; wherein the filter includes first and second filter portions, the first filter portion being disposed on a signal line electrically connecting the input terminal and the output terminal, the second filter portion being connected between the signal line and a ground;

each of the first and second filter portions includes a surface acoustic wave resonator including an IDT electrode provided on a piezoelectric substrate;

the IDT electrode includes a first busbar, a second busbar, a plurality of first electrode fingers, and a plurality of second electrode fingers, the second busbar opposing the first busbar, the plurality of first electrode fingers extending from the first busbar toward the second busbar so as not to reach the second busbar, the plurality of second electrode fingers extending from the second busbar toward the first busbar so as not to reach the first busbar, the plurality of second electrode fingers being disposed between the plurality of first electrode fingers in an interdigitated manner; and in the surface acoustic wave resonator of the second filter portion, at least some of the first and second electrode fingers are electrically connected to each other.

2. The radio-frequency module according to claim 1, wherein the filter is a ladder filter including a series arm and a parallel arm;

the first filter portion defines the series arm of the ladder filter; and the second filter portion defines the parallel arm of the ladder filter.

3. The radio-frequency module according to claim 2, wherein the surface acoustic wave resonator defining the second filter portion in which at least some of the first and second electrode fingers are electrically connected to each other is connected between the amplifier and the surface acoustic wave resonator defining the first filter portion positioned closest to the amplifier.

4. The radio-frequency module according to claim 1, wherein the first filter portion of the filter includes a longitudinally coupled resonator filter.

* * * * *